(12) United States Patent
Satoh et al.

(10) Patent No.: US 8,318,034 B2
(45) Date of Patent: Nov. 27, 2012

(54) SURFACE PROCESSING METHOD

(75) Inventors: Naoyuki Satoh, Nirasaki (JP);
Nobuyuki Nagayama, Nirasaki (JP);
Keiichi Nagakubo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 213 days.

(21) Appl. No.: 12/833,406

(22) Filed: Jul. 9, 2010

(65) Prior Publication Data

US 2011/0006037 A1 Jan. 13, 2011

Related U.S. Application Data

(60) Provisional application No. 61/238,240, filed on Aug. 31, 2009.

(30) Foreign Application Priority Data

Jul. 10, 2009 (JP) .................................. 2009-163418

(51) Int. Cl.
*B44C 1/22* (2006.01)

(52) U.S. Cl. .............................. 216/57; 216/62; 427/344

(58) Field of Classification Search ........................ None
See application file for complete search history.

(56) References Cited

U.S. PATENT DOCUMENTS

| | | | |
|---|---|---|---|
| 5,093,148 A * | 3/1992 | Christodoulou et al. ...... 427/580 |
| 6,120,640 A * | 9/2000 | Shih et al. ................... 156/345.1 |
| 6,214,472 B1 * | 4/2001 | Barton et al. ................. 428/446 |
| 6,250,251 B1 * | 6/2001 | Akiyama et al. .......... 118/723 E |
| 6,825,051 B2 * | 11/2004 | AmRhein et al. ................. 438/9 |
| 6,974,781 B2 * | 12/2005 | Timmermans et al. ........ 438/794 |
| 7,579,067 B2 * | 8/2009 | Lin et al. ....................... 428/220 |
| 7,780,786 B2 * | 8/2010 | Mitsuhashi et al. .......... 118/715 |
| 7,802,539 B2 * | 9/2010 | Bosch ........................ 118/723 E |
| 7,850,864 B2 * | 12/2010 | Kobayashi ....................... 216/58 |
| 8,021,743 B2 * | 9/2011 | Lin et al. ....................... 428/220 |
| 8,118,941 B2 * | 2/2012 | Kuznetsov .................... 118/728 |
| 2003/0015731 A1 * | 1/2003 | Curless et al. ................ 257/200 |
| 2004/0261946 A1 | 12/2004 | Endoh et al. |
| 2006/0096703 A1 | 5/2006 | Moriya et al. |
| 2006/0099457 A1 * | 5/2006 | Moriya et al. ................. 428/701 |
| 2007/0054092 A1 * | 3/2007 | Harada et al. ................. 428/141 |
| 2007/0215283 A1 * | 9/2007 | Kobayashi ............... 156/345.43 |
| 2009/0120358 A1 * | 5/2009 | Harada et al. ................. 118/300 |
| 2009/0130436 A1 * | 5/2009 | Harada et al. ................. 428/332 |

(Continued)

FOREIGN PATENT DOCUMENTS

CN 1440563 A 9/2003

(Continued)

OTHER PUBLICATIONS

Office Action issued Sep. 1, 2011, in Chinese Patent Application No. 201010226907.1 (with English-language translation).

*Primary Examiner* — Allan Olsen
(74) *Attorney, Agent, or Firm* — Oblon, Spivak, McClelland, Maier & Neustadt, L.L.P.

(57) ABSTRACT

In a surface processing method for processing a surface of a member made of silicon carbide (SiC) and having a fragmental layer on a surface thereof, the surface of the member having the fragmental layer is modified into a dense layer to reduce the number of particles generated from the surface of the member when the member is applied to a plasma processing apparatus. Here, the SiC of the surface of the member is recrystallized by heating the fragmental layer.

4 Claims, 6 Drawing Sheets

U.S. PATENT DOCUMENTS

| | | |
|---|---|---|
| 2009/0208667 A1* | 8/2009 | Harada et al. ............ 427/551 |
| 2010/0314356 A1* | 12/2010 | Nagayama et al. ........ 216/52 |
| 2011/0006037 A1* | 1/2011 | Satoh et al. ............ 216/57 |
| 2011/0030896 A1* | 2/2011 | Kobayashi ............ 156/345.4 |
| 2011/0092013 A1* | 4/2011 | Isaka et al. ............ 438/89 |
| 2011/0129969 A1* | 6/2011 | Kato et al. ............ 438/166 |
| 2011/0239429 A1* | 10/2011 | Hambek ............ 29/402.01 |

FOREIGN PATENT DOCUMENTS

| | | |
|---|---|---|
| CN | 1445164 A | 10/2003 |
| CN | 1790615 A | 6/2006 |
| CN | 201269842 Y | 7/2009 |
| JP | 2005-64460 | 3/2005 |
| WO | WO 02/03427 A3 | 1/2002 |

* cited by examiner

SURFACE PROCESSING METHOD

CROSS-REFERENCE TO RELATED APPLICATIONS

This application claims priority to Japanese Patent Application No. 2009-163418 filed on Jul. 10, 2009 and U.S. Provisional Application No. 61/238,240 filed on Aug. 31, 2009, the entire contents of which are incorporated herein by reference.

FIELD OF THE INVENTION

The present invention relates to a surface processing method for processing a surface of a structural member in a processing chamber of a substrate processing apparatus.

BACKGROUND OF THE INVENTION

As for a substrate processing apparatus, there is known a plasma processing apparatus for processing a substrate by using a plasma. The plasma processing apparatus includes an evacuable processing chamber for generating a plasma therein and accommodating a wafer as a substrate to be processed. Provided in the chamber are various components (hereinafter, referred to as "structural members") such as a mounting table (susceptor) for mounting thereon a wafer; a shower head (upper electrode plate) disposed above the susceptor so as to face the susceptor, for introducing a processing gas into the chamber; a focus ring (F/R) installed around an outer peripheral portion of the susceptor and surrounding the substrate to be processed; and the like.

Due to the presence of the focus ring, a plasma distribution region in the chamber extends from above the wafer to above the focus ring. Therefore, a plasma density at a peripheral portion of the wafer is maintained at a level substantially equal to that at a central portion of the wafer W. Accordingly, uniformity of plasma processing on the entire surface of the wafer is ensured.

In the chamber for performing plasma processing on the wafer, there is a need to prevent generation of particles causing contamination in order to increase a production yield of the wafer. For that reason, the structural members in the chamber are preferably made of dense materials. The dense materials can be obtained by a CVD (Chemical Vapor Deposition) method. Accordingly, for example, a focus ring is preferably manufactured by cutting a lump of material (bulk material) obtained by the CVD method.

Generally, the materials of the structural members include silicon (Si), silicon carbide (SiC) and the like. In case of Si, however, a dense bulk material cannot be obtained from Si by the CVD method. Hence, when manufacturing the focus ring from a dense bulk material, SiC to which the CVD method can be applied is preferably used as a material of the focus ring. Further, although SiC can be subjected to a sintering method, the sintering method is not suitable for forming the dense bulk material unlike the CVD method. If a structural member formed by cutting a bulk material obtained by the sintering method is provided in the chamber, it may be a cause of generation of particles.

Therefore, recently, SiC is preferably used as a material of a structural member such as a focus ring or the like (see, e.g., Japanese Patent Application Publication No. 2005-064460). The CVD method is used to form the structural member such as the focus ring or the like. A bulk material obtained by the CVD method is denser than that obtained by the sintering method, and thus is properly used as a material of a structural member which suppresses generation of particles.

Microcracks generated during the process of forming a bulk material of SiC obtained by the CVD method lead to formation of a fragmental layer having a thickness of about 20 μm on a surface of, e.g., the focus ring manufactured by cutting the bulk material. This fragmental layer causes generation of particles. In other words, when the focus ring having the fragmental layer is provided in the chamber of the plasma processing apparatus, particles are generated by the fragmental layer until the fragmental layer is removed, and this decreases a production yield of the wafer. A fragmental layer caused by microcracks is also found in a brittle member such as silicon (Si), quartz, alumina ceramic or the like.

Thus, various surface processing methods have been studied to remove a fragmental layer formed on a surface of a structural member such as a focus ring or the like of the plasma processing apparatus.

However, as the surface processing method, a wet process using a liquid chemical, e.g., hydrofluoric acid, nitric acid or the like, cannot be used because SiC is stable to various liquid chemicals. Also, mechanical polishing using an abrasive is suitable for a flat portion such as a backside or a side surface of the focus ring, but is not suitable for a corner of a stepped portion thereof. Therefore, it is common to remove the fragmental layer by a manual polishing operation, which requires a high cost and a long polishing time.

SUMMARY OF THE INVENTION

In view of the above, the present invention provides a surface processing method capable of easily removing fragmental layers formed on surfaces of various structural members made of SiC, especially a fragmental layer formed at a stepped portion.

In accordance with an embodiment of the present invention, there is provided a surface processing method for processing a surface of a member made of silicon carbide (SiC) and having a fragmental layer on a surface thereof, the method including: modifying the surface of the member having the fragmental layer into a dense layer to reduce the number of particles generated from the surface of the member when the member is applied to a plasma processing apparatus.

BRIEF DESCRIPTION OF THE DRAWINGS

The objects and features of the present invention will become apparent from the following description of embodiments, given in conjunction with the accompanying drawings, in which:

FIGS. 2A and 2B illustrate an enlarged view of a focus ring of FIG. 1, wherein FIG. 2A is a top view and FIG. 2B is a cross sectional view taken along line II-II of FIG. 2A;

FIGS. 8A and 8B show a configuration of an upper electrode plate, wherein FIG. 8A is a top view and FIG. 8B is a cross sectional view taken along line VIII-VIII of FIG. 8A.

DETAILED DESCRIPTION OF THE EMBODIMENT

The embodiments of the present invention will be described with reference to the accompanying drawings which form a part hereof.

Figure 1:
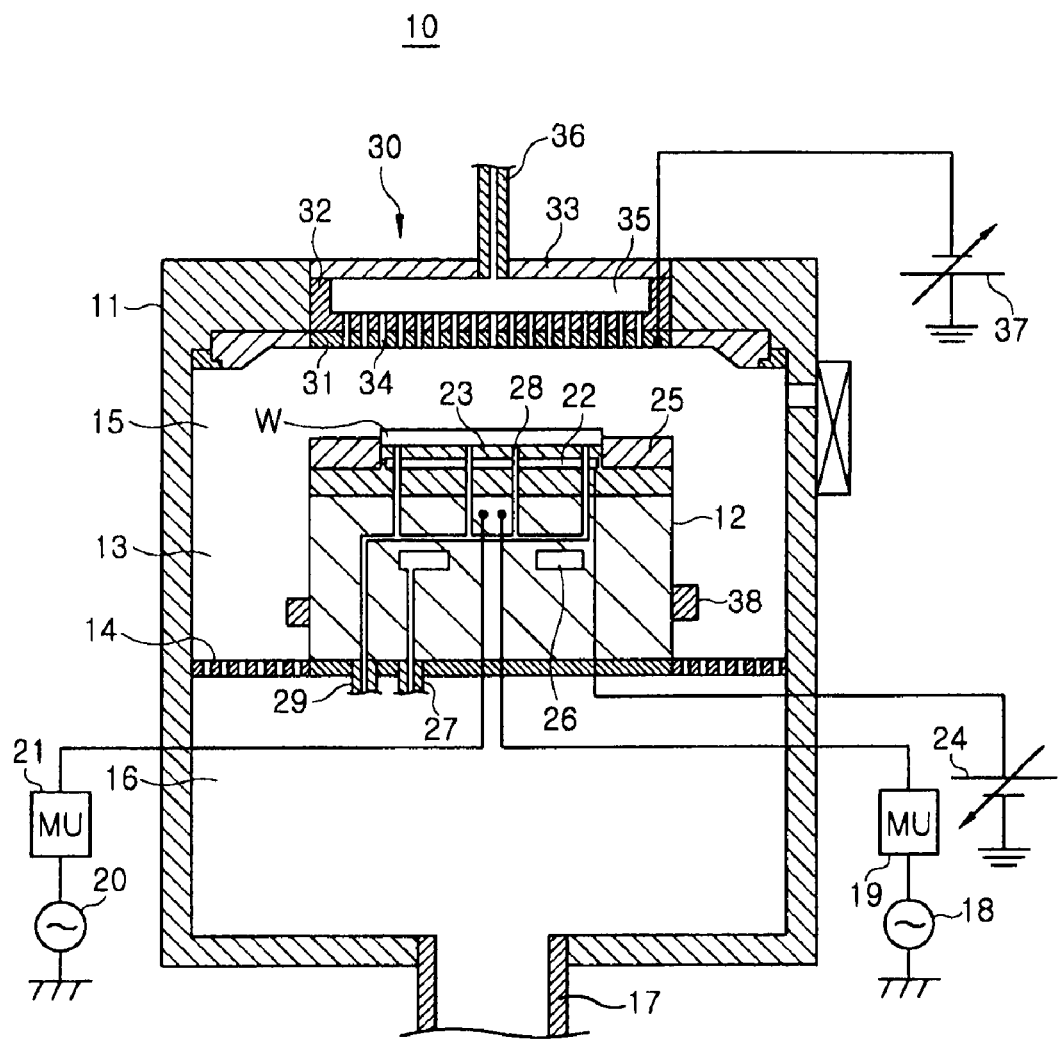
FIG. 1 is a cross sectional view schematically showing a configuration of a plasma processing apparatus having various structural members to which a surface processing method in accordance with an embodiment of the present invention is applied.

FIG. 1 is a cross sectional view schematically showing a configuration of a plasma processing apparatus having various structural members to which a surface processing method in accordance with an embodiment of the present invention is applied. This plasma processing apparatus performs a plasma etching process on a semiconductor device wafer as a substrate (hereinafter, simply referred to as a "wafer").

Referring to FIG. 1, a plasma processing apparatus 10 includes a chamber 11 for accommodating a wafer W, and a cylindrical susceptor 12 for mounting thereon the wafer W is provided in the chamber 11. In the plasma processing apparatus 10, a side exhaust passageway 13 is defined by an inner wall of the chamber 11 and a side surface of the susceptor 12. A gas exhaust plate 14 is provided in the middle of the side exhaust passageway 13.

The gas exhaust plate 14 is a plate-shaped member having a plurality of through holes and functions as a partition plate for separating an upper portion of the inside of the chamber 11 from a lower portion thereof. As will be described later, a plasma is generated in an upper portion (hereinafter, referred to as "processing chamber" 15) in the chamber 11 which is partitioned by the gas exhaust plate 14. Further, the lower portion (hereinafter, referred to as "gas exhaust space (manifold)" 16) in the chamber 11 is connected to a gas exhaust line 17 through which a gas in the chamber 11 is exhausted. The gas exhaust plate 14 captures or reflects the plasma generated in the processing chamber 15 to prevent the leakage of the plasma into the manifold 16.

A turbo molecular pump (TMP) and a dry pump (DP) (both not shown) are connected to the gas exhaust line 17, and depressurize the inside of the chamber 11 to a vacuum state. Moreover, the pressure in the chamber 11 is controlled by an automatic pressure control (APC) valve (not shown).

The susceptor 12 in the chamber 11 is connected to a first high frequency power supply 18 via a first matching unit (MU) 19 and also connected to a second high frequency power supply 20 via a second matching unit (MU) 21. The first high frequency power supply 18 supplies a bias high frequency power which has a relatively low frequency, e.g., about 2 MHz, to the susceptor 12, and the second high frequency power supply 20 supplies a high frequency power for plasma generation which has a relatively high frequency, e.g., about 60 MHz, to the susceptor 12. Accordingly, the susceptor 12 serves as an electrode. Furthermore, the first and the second matching unit 19 and 21 reduce reflection of the high frequency powers from the susceptor 12 to maximize the supply efficiency of the high frequency powers to the susceptor 12.

An electrostatic chuck 23 having therein an electrostatic electrode plate 22 is disposed on the susceptor 12. The electrostatic chuck 23 is made of ceramic and has a stepped portion.

The electrostatic electrode plate 22 is connected to a DC power supply 24. When a positive DC voltage is applied to the electrostatic electrode plate 22, a negative potential is generated on a surface (hereinafter, referred to as "backside") of the wafer W which faces the electrostatic chuck 23, and this causes a potential difference between the electrostatic electrode plate 22 and the backside of the wafer W. The wafer W is attracted and held on the electrostatic chuck 23 by a Coulomb force or a Johnson-Rahbeck force generated due to the potential difference.

Besides, a focus ring 25 is mounted on a horizontal surface of the stepped portion of the electrostatic chuck 23 so as to surround the wafer W attracted and held on the electrostatic chuck 23. The focus ring 25 is made of SiC.

An annular coolant passage 26 is provided inside the susceptor 12, the annular coolant passage 26 extending, e.g., in a circumferential direction of the susceptor 12. A low-temperature coolant, e.g., cooling water or Galden (registered trademark), is supplied from a chiller unit (not shown) to the coolant passage 26 via a coolant line 27 to be circulated therein. The susceptor 12 cooled by the coolant cools the wafer W and the focus ring 25 through the electrostatic chuck 23.

A plurality of heat transfer gas supply holes 28 opens at a portion (hereinafter, referred to as "attraction surface") of the electrostatic chuck 23 on which the wafer W is attracted and held. The heat transfer gas supply holes are connected to a heat transfer gas supply unit (not shown) via a heat transfer gas supply line 29. The heat transfer gas supply unit supplies a heat transfer gas, e.g., helium (He) gas, into a gap between the attraction surface and the backside of the wafer W through the heat transfer gas supply holes 28. The He gas supplied into the gap between the attraction surface and the backside of the wafer W efficiently transfers heat of the wafer W to the electrostatic chuck 23.

A shower head 30 is provided at a ceiling portion of the chamber 11 so as to face the susceptor 12. The shower head 30 includes an upper electrode plate 31, a cooling plate 32 that detachably holds the upper electrode plate 31, and a lid 33 for covering the cooling plate 32. The upper electrode plate 31 is a circular plate-shaped member having a plurality of gas holes 34 extending therethrough in a thickness direction thereof, and is made of SiC as a semiconductor material. Moreover, a buffer space 35 is defined inside the cooling plate 32, and a processing gas inlet line 36 is connected to the buffer space 35.

In addition, a DC power supply 37 is connected to the upper electrode plate 31 of the shower head 30 and applies a negative DC voltage to the upper electrode plate 31. At this time, the upper electrode plate 31 emits secondary electrons to prevent an electron density on the wafer W from decreasing in the processing chamber 15. The emitted secondary electrons flow from the wafer W to a ground electrode (ground ring) 38 made of a semiconductor material, e.g., SiC or Si, the ground electrode 38 being provided to surround the side surface of the susceptor 12 in the side exhaust passageway 13.

In the plasma processing apparatus 10, the processing gas supplied from the processing gas inlet line 36 to the buffer space 35 is introduced into the processing chamber 15 through the gas holes 34, and the introduced processing gas is excited and converted into a plasma by the high frequency power for plasma generation which is supplied from the second high frequency power supply 20 to the processing chamber 15 via the susceptor 12. Ions in the plasma are attracted toward the wafer W by the bias high frequency power applied from the first high frequency power supply 18 to the susceptor 12, so that the wafer W is subjected to a plasma etching process.

The operation of the components of the above-described plasma processing apparatus 10 is controlled based on a program, corresponding to the plasma etching process, by a CPU of a control unit (not shown) of the plasma processing apparatus 10.

Figure 2A:
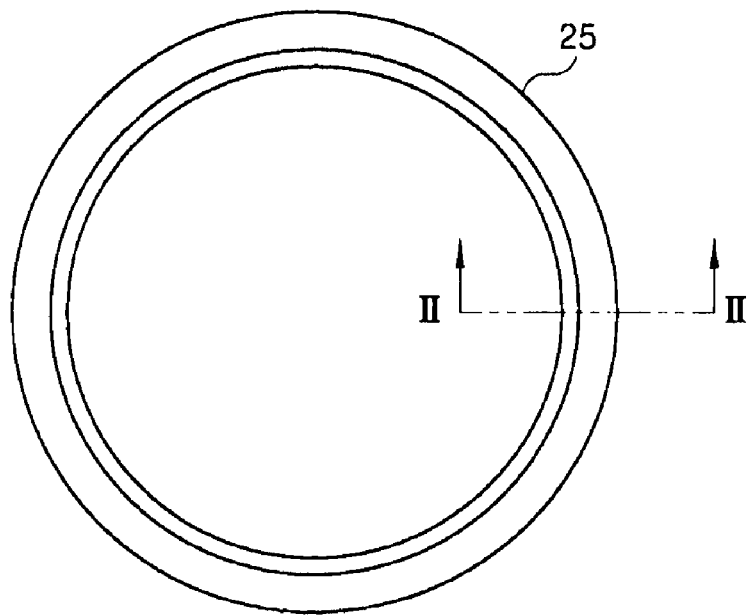
Figure 2B:
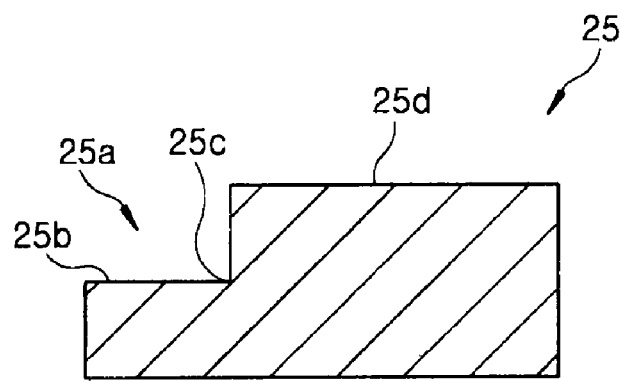

FIGS. 2A and 2B illustrate enlarged views of the focus ring of FIG. 1, wherein FIG. 2A is a top view and FIG. 2B is a cross sectional view taken along line II-II of FIG. 2A.

Referring to FIGS. 2A and 2B, the focus ring 25 is a ring-shaped member having a stepped portion 25a at an inner peripheral portion thereof, and is formed of a single substance of SiC as described above. The stepped portion 25a is formed to correspond to the outer peripheral portion of the wafer W.

Since the focus ring 25 is formed by cutting a bulk material of SiC obtained by a CVD method as described above, a fragmental layer caused by microcracks is formed on a surface thereof. Especially, a fragmental layer formed near the stepped portion 25a, which cannot be completely eliminated by a polishing process, causes generation of particles.

Figure 3:
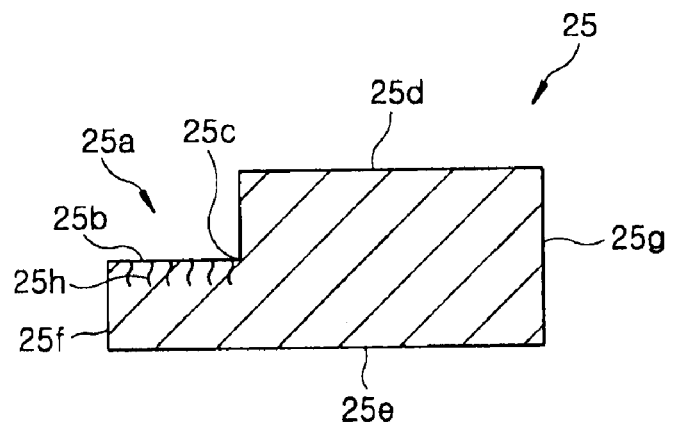
FIG. 3 provides a cross sectional view of a fragmental layer formed at a stepped portion on a surface of the focus ring of FIG. 2B.

FIG. 3 provides a cross sectional view of fragmental layer formed at a stepped portion on a surface of the focus ring of FIG. 2.

Referring to FIG. 3, a top surface 25d, a bottom surface 25e and side surfaces 25g and 25f of the focus ring can be polished mechanically. On the contrary, a horizontal portion 25b and a corner portion 25c of the stepped portion 25a cannot be polished mechanically and is polished only by human hands.

The present inventors have studied a surface processing method for removing a fragmental layer generated during a manufacturing process of a focus ring. As a result, they have found that the fragmental layer can be eliminated by recrystallizing SiC by heating the surface of the focus ring or by executing predetermined pre-treatment and then liquid chemical treatment, and that this can prevent the generation of particles caused by the fragmental layer of the focus ring.

Figure 4:
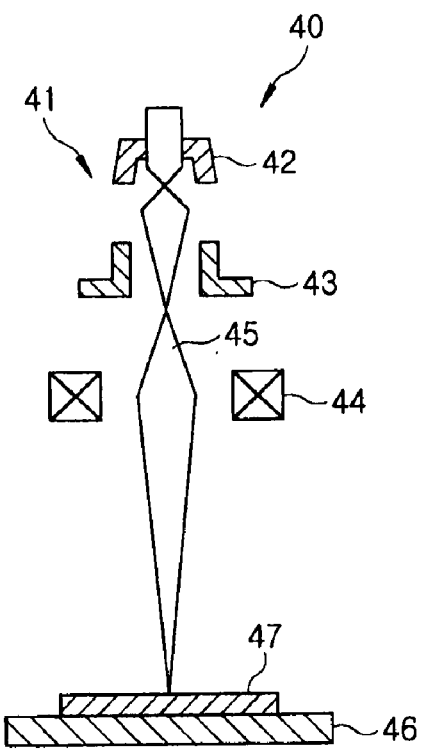
FIG. 4 shows a schematic configuration of an electron beam irradiation unit applied to a first embodiment of the present invention.

FIG. 4 shows a schematic configuration of an electron beam irradiation unit applied to a first embodiment of the present invention.

Referring to FIG. 4, an electron beam irradiation unit 40 mainly includes an electron gun 41 having a cathode 42 and an anode 43, which are arranged along an electron beam irradiation direction, and a focus coil 44 disposed near a leading end portion of the electron gun 41.

The cathode 42 of the electron gun 41 is made of, e.g., a filament, and the filament generates thermal electrons when heated. The thermal electrons thus generated are accelerated by applying a voltage of, e.g., about 60 kV to 150 kV, to the cathode 42 and the anode 43, and become electron beams 45. The electron beams 45 are focused by the focus coil 44 and irradiated to an object to be heated 47 mounted on a mounting table 46.

The focus ring 25 is mounted on the mounting table 46, and the fragmental layer 25h on the surface of the focus ring 25 is heated to, e.g., about 1100° C. to 1300° C., by irradiation of electron beams by the electron beam irradiation unit 40. At this time, SiC of the heated fragmental layer 25h is recrystallized, and the fragmental layer 25h becomes a dense layer.

In accordance with this embodiment, the fragmental layer 25h of the focus ring 25 can be modified into a dense layer by heating the fragmental layer 25h to a recrystallization temperature by irradiating electron beams. Accordingly, the fragmental layer 25h on the surface of the focus ring 25, which is heretofore polished by a machine or human hands, especially the fragmental layer 25h formed at a stepped portion which is difficult to be polished, can be easily modified into a dense layer. Therefore, when the focus ring 25 is employed in the chamber of the plasma processing apparatus, the generation of particles caused by the fragmental layer 25h can be prevented.

Figure 5:
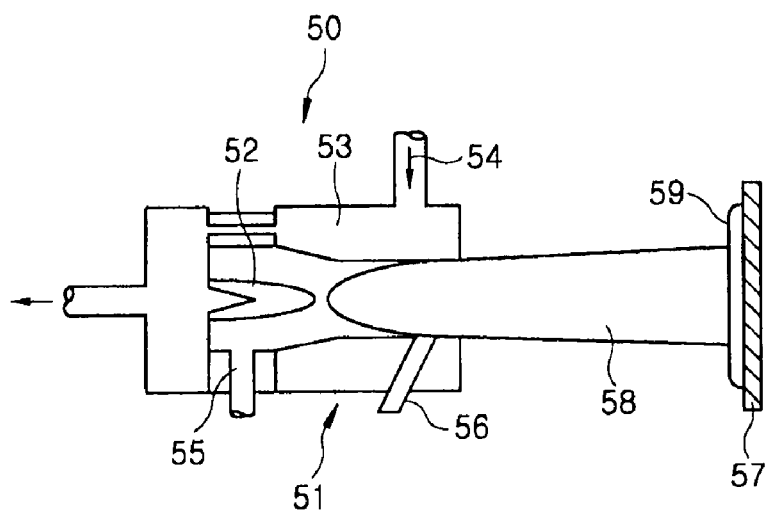
FIG. 5 depicts a schematic configuration of a plasma torch applied to a second embodiment of the present invention.

FIG. 5 shows a schematic configuration of a plasma torch applied in a second embodiment of the present invention. Referring to FIG. 5, a plasma torch 50 mainly includes a nozzle main body 51, a cathode 52 arranged substantially at a center of the nozzle main body 51 along an irradiation direction of a plasma jet 58, and an anode 53 provided around the cathode 52 so as to surround the cathode 52. The cathode 52 is made of, e.g., tungsten, and the anode 53 is made of, e.g., copper. The cathode 52 and the anode 53 have, e.g., jacket structures communicating with each other, and the plasma torch 50 is cooled by cooling water 54 flowing in the jacket structures.

The nozzle main body 51 is provided with an inlet line 55 for an operation gas for plasma generation and an inlet line 56 for a powder material as a plasma source. The powder material is introduced toward vicinity of an outlet of the plasma jet 58 of the nozzle main body 51.

As a gas for plasma generation, e.g., helium (He) gas is used. He gas is supplied toward the cathode 52 via the operation gas inlet line 55. Since He gas has high excitation and ionization energy and a small mass number, a plasma of He gas can excite and ionize every element used as a powder material. As for the powder material, it is preferable to use, e.g., ceramic, cement, metal or the like.

In the plasma torch 50, the He gas introduced toward the cathode 52 is excited by a DC arc discharge generated between the cathode 52 and the anode 53 to be converted into a plasma. The helium plasma thus generated is irradiated toward an object to be processed 57 through the plasma jet 58 while exciting and ionizing the plasma source introduced via the powder material inlet line 56. As a consequence, a thermally sprayed film 59 is formed on the surface of the object to be processed 57.

With the plasma torch 50 configured as described above, if the helium plasma is irradiated to the fragmental layer 25h on the surface of the focus ring 25 without supplying a powder material, the fragmental layer 25h is heated to, e.g., about 1100° C. to 1300° C. and modified into a dense layer due to recrystallization of SiC of the corresponding portion.

In accordance with this embodiment, the fragmental layer 25h on the surface of the focus ring 25 can be heated to be recrystallized by using the plasma torch 50. As a consequence, the fragmental layer 25h on the surface of the focus ring 25 can be modified into a dense layer.

In this embodiment, the plasma torch 50 is fixed to a predetermined position, and the focus ring 25 is rotated. Accordingly, the fragmental layer 25h of the focus ring 25 sequentially passes a plasma irradiation position of the plasma torch 50 during the plasma processing. Alternatively, the plasma irradiation position of the plasma torch 50 may be shifted along the fragmental layer 25h on the surface of the focus ring 25 in a state where the focus ring 25 is fixed.

In this embodiment, a new SiC thin film having a size that does not change the size of the focus ring 25 may be formed on the surface of the focus ring 25 by introducing SiC as a powder material for plasma generation, converting the SiC into a plasma, and bringing the plasma of SiC into contact with the surface of the focus ring 25. In this way, a dense layer can be formed on the surface of the focus ring 25.

Hereinafter, a third embodiment of the present invention will be described. This embodiment can be implemented by using the same plasma torch as that used in the second embodiment.

In the plasma torch 50 of FIG. 5, an oxygen plasma using $O_2$ gas as an operation gas is irradiated to the fragmental layer 25h on the surface of the focus ring 25. The fragmental layer 25h on the surface of the focus ring 25 to which the oxygen plasma is irradiated is heated in the oxygen plasma, and SiC of the corresponding portion is oxidized by the oxygen radical and turned into $SiO_xC_y$ which is soluble in an acid. Next, the generated $SiO_xC_y$ is eluted by a hydrofluoric acid treatment, so that even the fragmental layer 25h at the stepped portion which is difficult to be polished can easily be eliminated. Consequently, the surface of the focus ring 25 becomes a dense layer.

In accordance with this embodiment, SiC of the surface of the focus ring 25 is turned into $SiO_xC_y$ that is soluble in acid by irradiating the oxygen plasma to the focus ring 25 made of SiC that is stable to hydrofluoric acid or nitric acid and, then, $SiO_xC_y$ is eluted by a liquid chemical process. Accordingly, even the fragmental layer 25h formed at the stepped portion which is difficult to be polished can be easily eliminated, and the surface of the focus ring 25 can be modified into a dense layer.

In this embodiment, it is preferable to repeat a process for oxidizing SiC by using an oxygen plasma and a liquid chemical process for eluting an $SiO_xC_y$ layer obtained by the oxidation process by using hydrofluoric acid multiple times. Since a single process is not enough to completely oxidize and elute SiC of the fragmental layer 25h, the surface having the fragmental layer 25h can be completely modified into a dense layer by repeating such processes multiple times, e.g., about 2 to 10 times.

Hereinafter, a surface processing method in accordance with a fourth embodiment of the present invention will be described. In this embodiment, the focus ring is annealed by heating to a predetermined temperature.

Figure 6:
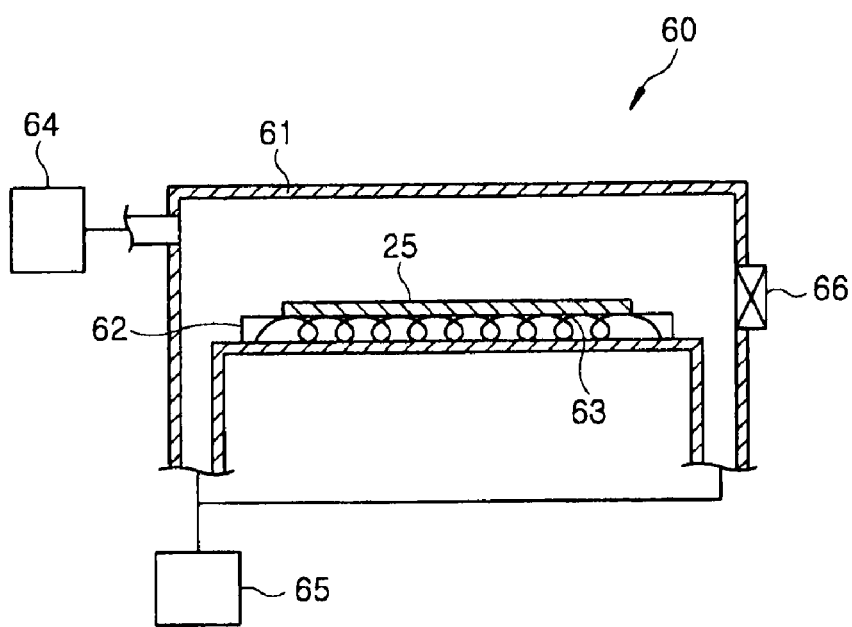
FIG. 6 presents a cross sectional view describing a schematic configuration of an annealing apparatus applied to a fourth embodiment of the present invention.

FIG. 6 presents a cross sectional view describing a schematic configuration of an annealing apparatus applied to the fourth embodiment of the present invention;

Referring to FIG. 6, an annealing apparatus 60 includes a processing chamber 61, a mounting table 62 provided within the processing chamber 61, and a heater 63 installed within the mounting table 62. The mounting table mounts thereon the focus ring 25 as an object to be processed, and the focus ring 25 is heated to a predetermined temperature by the heater 63. The processing chamber 61 has a gas introduction mechanism 64 for forming an annealing atmosphere and a depressurization mechanism 65 for controlling a pressure in the processing chamber 61 to a predetermined level. Further, a gate valve 66 for loading and unloading an object to be processed is installed on a sidewall of the processing chamber vessel 61.

In the annealing apparatus 60 configured as described above, the surface processing method in accordance with this embodiment is performed as will be described below.

Figure 7:
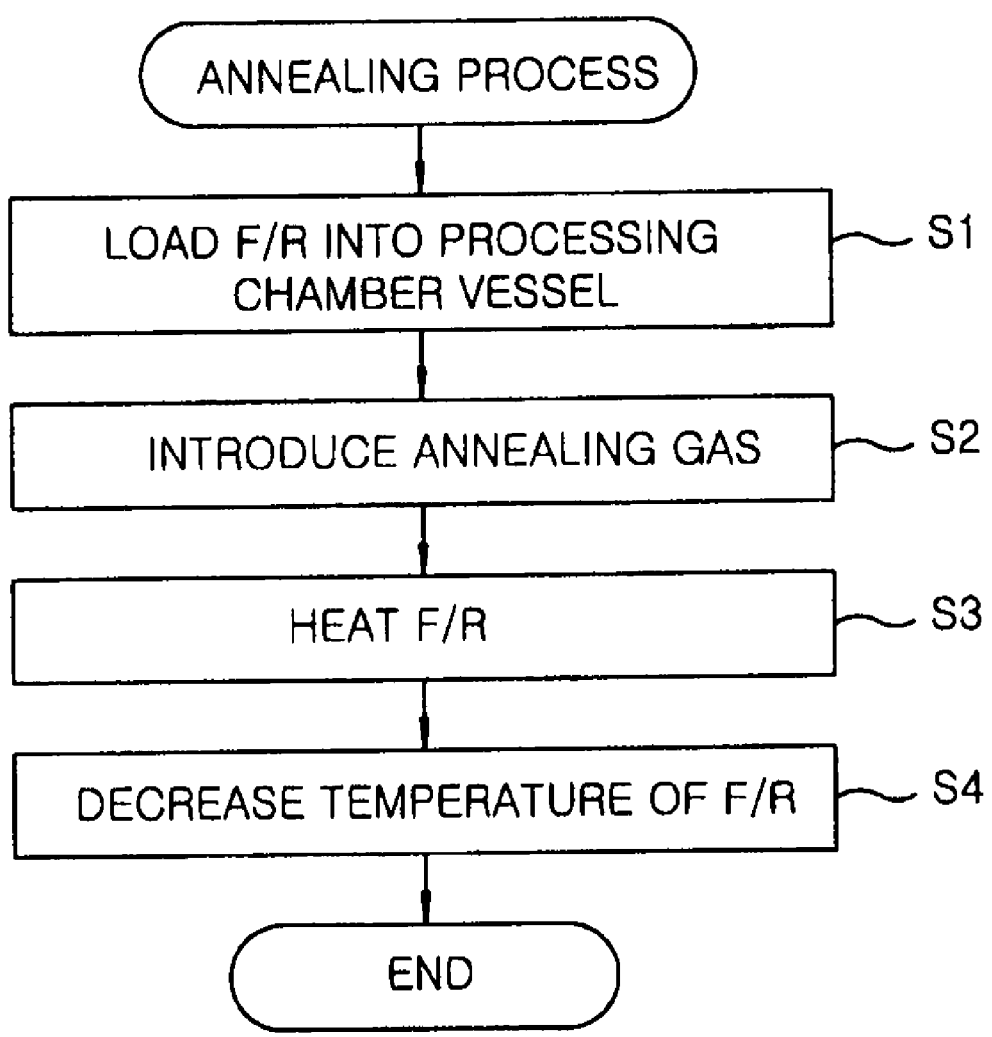
FIG. 7 offers a flowchart describing surface processing procedures of a surface processing method in accordance with an embodiment of the present invention.

FIG. 7 offers a flowchart describing surface processing procedures of the surface processing method in accordance with the present embodiment. Referring to FIG. 7, in order to process a surface of the focus ring 25, first of all, the focus ring (F/R) 25 having a fragmental layer is loaded into the processing chamber 61 via the gate valve 66 by a transfer unit (not shown) and then mounted on the mounting table 62 in step S1.

Next, the gate valve 66 is closed, and an annealing gas, e.g., $N_2$ gas, is introduced from a gas introduction mechanism 64. At the same time, the inside of the processing chamber 61 is depressurized by the depressurization mechanism 65 so that a gas in the processing chamber is replaced by $N_2$ gas in step S2. Thereafter, the focus ring 25 is heated to, e.g., about 1100° C. to 1300° C., for one hour by the heater 63 in step S3. At this time, the surface of the focus ring 25 is recrystallized to be turned to a dense layer, and the fragmental layer 25h is eliminated.

After the fragmental layer is eliminated, the heating by the heater 63 is stopped, and the temperature of the focus ring 25 is decreased in step S4. After the temperature of the focus ring 25 is decreased, the focus ring 25 is unloaded from the processing chamber vessel 61, and the annealing process is completed.

In accordance with this embodiment, the surface of the focus ring 25 can be modified into a dense layer by recrystallizing SiC of the fragmental layer 25h formed on the entire surface of the focus ring 25. Even if the focus ring 25 has the stepped portion 25a, SiC of the stepped portion 25a as well as SiC of surfaces of the other portion is recrystallized to become a dense layer, so that all of the fragment layers can be eliminated. Accordingly, when the annealed focus ring 25 is employed in the chamber 11 of the plasma processing apparatus 10, the generation of particles caused by the fragmental layer 25h can be prevented.

In accordance with this embodiment, the surface roughness is improved to a level same as or higher than that obtained by mechanical polishing. Further, it has been confirmed that the number of generated particles greater than or equal to about 0.12 μm was reduced to 18 per a unit area after the surface processing of FIG. 7 while it was about 2201 before the surface processing of FIG. 7.

In this embodiment, a heating temperature of the focus ring 25 is preferably between about 1100° C. to about 1300° C. At this temperature range, SiC of the fragmental layer 25h on the surface of the focus ring 25 can be recrystallized so that the fragmental layer 25h is modified into a dense layer while maintaining the shape of the focus ring 25. At this time, the pressure in the processing chamber 61 is, e.g., about 1.3 Pa (10 mTorr) to $1.3 \times 10^3$ Pa (10 Torr), and the heating time is, e.g., about 0.5 to 3 hours.

The following is description of a fifth embodiment of the present invention.

This embodiment is a surface processing method for eliminating a fragmental layer formed, during a grinding process, on a surface of a structural member of a plasma processing apparatus by performing a thermal CVD process. The structural member is, e.g., a focus ring manufactured by cutting an SiC bulk material obtained by a CVD method. Specifically, when the thermal CVD process using a source gas containing SiC is performed on the surface of the focus ring 25 cut from the SiC bulk material, the fragmental layer 25h is heated to the SiC recrystallization temperature and the surface of the focus ring 25 becomes a dense layer. Further, a new CVD film made of SiC is formed on the dense layer.

In this embodiment, as in the aforementioned embodiments, the fragmental layer on the surface of the focus ring 25 can be eliminated and the surface of the focus ring 25 can become a dense layer. Also, the surface of the member may have fine appearance.

In this embodiment, a thickness of the new CVD film is preferably set to a level at which the size of the focus ring 25 is not changed, e.g., smaller than or equal to about 10 μm.

In the above-described embodiments, the focus ring 25 is used as a member on which the surface processing method is performed. However, a member to be processed is not limited to the focus ring 25, and may be an upper electrode plate employed in the chamber of the plasma processing apparatus of FIGS. 8A and 8B or any other structural members made of SiC.

Figure 8A:
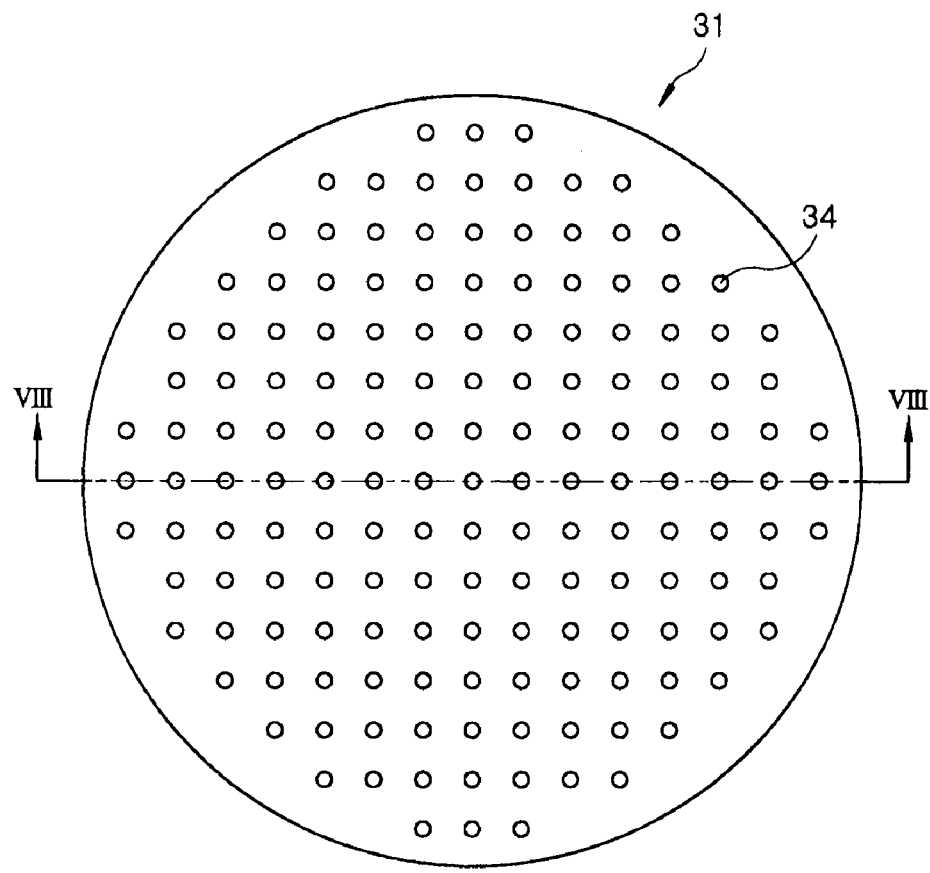
Figure 8B:
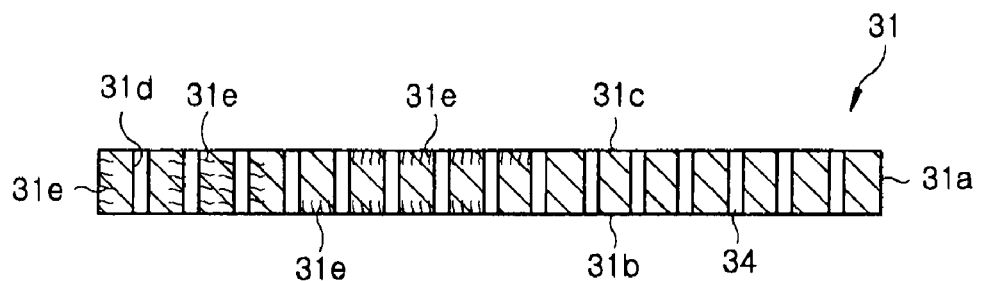

FIGS. 8A and 8B show a configuration of an upper electrode plate, wherein FIG. 8A is a top view of the upper electrode plate and FIG. 8B is a cross sectional view taken along line VIII-VIII of FIG. 8A.

Referring to FIGS. 8A and 8B, the upper electrode plate 31 has a plurality of gas holes 34 penetrating therethrough in a thickness direction thereof. Further, the upper electrode 31 is formed by cutting a bulk material of SiC, as in the case of the focus ring 25. Therefore, fragmental layers 31e generated by microcracks are formed on a side surface 31a, a bottom surface 31b and a top surface 31c of the upper electrode 31 and inner surfaces 31d of the gas holes 34, and the fragmental layers 31e may be a cause of generation of particles.

Therefore, as in the case of the focus ring 25, the upper electrode plate 31 is preferably subjected to surface processing. Accordingly, the surfaces having the fragmental layers 31e can be modified into dense layers, and this can prevent generation of particles. Although it is difficult to polish peripheral portions of the gas holes 34 of the upper electrode plate 31, the surfaces of the upper electrode plate 31 which have the fragmental layers 31e can be easily modified into dense layers by applying the surface processing method of the present invention.

As described above, since a surface of a member having a fragmental layer is modified into a dense layer, it is possible to completely eliminate all of the fragmental layers formed on the surface of the member including a stepped portion. Accordingly, the number of particles generated from the surface of the member employed in the plasma processing apparatus can be reduced.

While the invention has been shown and described with respect to the embodiments, it will be understood by those skilled in the art that various changes and modification may be made without departing from the scope of the invention as defined in the following claims.

What is claimed is:

1. A surface processing method for processing a surface of a member made of silicon carbide (SiC) and having a fragmental layer on a surface thereof, the method comprising:
   modifying the surface of the member having the fragmental layer into a dense layer to reduce the number of particles generated from the surface of the member when the member is applied to a plasma processing apparatus,
   wherein the SiC of the surface of the member is turned into $SiO_xC_y$ by heating the fragmental layer in an oxygen plasma and, then, the $SiO_xC_y$ of the surface of the member is eluted by a hydrofluoric acid treatment.

2. The surface processing method of claim 1, wherein a process for turning SiC of the surface of the member into $SiO_xC_y$ and a process for performing the hydrofluoric acid treatment on the $SiO_xC_y$ of the surface of the member are repeated multiple times.

3. The surface processing method of claim 1, wherein the plasma processing apparatus includes an evacuable processing chamber in which a plasma is generated and a substrate to be processed is subjected to plasma processing, and the member is a structural member employed in the evacuable processing chamber of the plasma processing apparatus.

4. The surface processing method of claim 3, wherein the structural member is a focus ring provided at a peripheral portion of a mounting table for mounting thereon the substrate to be processed.

* * * * *